United States Patent
Iwakura

(10) Patent No.: US 9,455,382 B2
(45) Date of Patent: Sep. 27, 2016

(54) LIGHT EMITTING DEVICE

(71) Applicant: NICHIA CORPORATION, Anan-shi, Tokushima (JP)

(72) Inventor: Daisuke Iwakura, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 37 days.

(21) Appl. No.: 14/323,684

(22) Filed: Jul. 3, 2014

(65) Prior Publication Data
US 2015/0008464 A1    Jan. 8, 2015

(30) Foreign Application Priority Data
Jul. 5, 2013   (JP) .................................. 2013-141326

(51) Int. Cl.
| H01L 33/00 | (2010.01) |
| H01L 33/50 | (2010.01) |
| H01L 33/56 | (2010.01) |

(52) U.S. Cl.
CPC ............. *H01L 33/508* (2013.01); *H01L 33/50* (2013.01); *H01L 33/502* (2013.01); *H01L 33/504* (2013.01); *H01L 33/56* (2013.01)

(58) Field of Classification Search
CPC ..... H01L 33/50; H01L 33/56; H01L 33/502; H01L 33/504; H01L 33/508
USPC ................ 257/79, 88, 98, 99, 100, E33.059, 257/E33.061, E33.072, E33.074, E25.02, 257/E21.353
See application file for complete search history.

(56) References Cited

U.S. PATENT DOCUMENTS

| 7,847,302 | B2* | 12/2010 | Basin et al. ..................... 257/88 |
| 8,330,178 | B2* | 12/2012 | Jeong ..................... H01L 33/60 |
| | | | 257/100 |
| 8,547,009 | B2* | 10/2013 | Hussell et al. ................ 313/499 |
| 8,637,887 | B2* | 1/2014 | Chan ..................... H01L 33/642 |
| | | | 257/675 |
| 2006/0073625 | A1* | 4/2006 | Harada .................. H01L 33/504 |
| | | | 438/29 |
| 2006/0220046 | A1* | 10/2006 | Yu et al. .......................... 257/98 |
| 2013/0193465 | A1* | 8/2013 | Xu .......................... H01L 33/504 |
| | | | 257/98 |
| 2015/0001565 | A1* | 1/2015 | Iwakura ................ H01L 33/508 |
| | | | 257/98 |

FOREIGN PATENT DOCUMENTS

| JP | 2004-179644 A | 6/2004 |
| JP | 2006-135300 A | 5/2006 |
| JP | 2007-103512 | 4/2007 |
| JP | 2009-170825 A | 7/2009 |
| JP | 2011-233923 A | 11/2011 |
| JP | 2011-249476 A | 12/2011 |
| JP | 2012-142430 A | 7/2012 |

\* cited by examiner

*Primary Examiner* — Dao H Nguyen
(74) *Attorney, Agent, or Firm* — Foley & Lardner LLP

(57) ABSTRACT

A light emitting device comprising: a package having a recess; a light emitting element mounted in the recess of the package; a transmissive member provided above the light emitting element; a sealing resin that seals the recess of the package; a first fluorescent material contained in the transmissive member; and a second fluorescent material contained in the sealing resin and having a specific gravity different from that of the first fluorescent material, wherein a greater amount of the second fluorescent material is distributed to a side of the light emitting element than above the light emitting element, and a side surface of the light emitting element is exposed on the sealing resin.

20 Claims, 9 Drawing Sheets

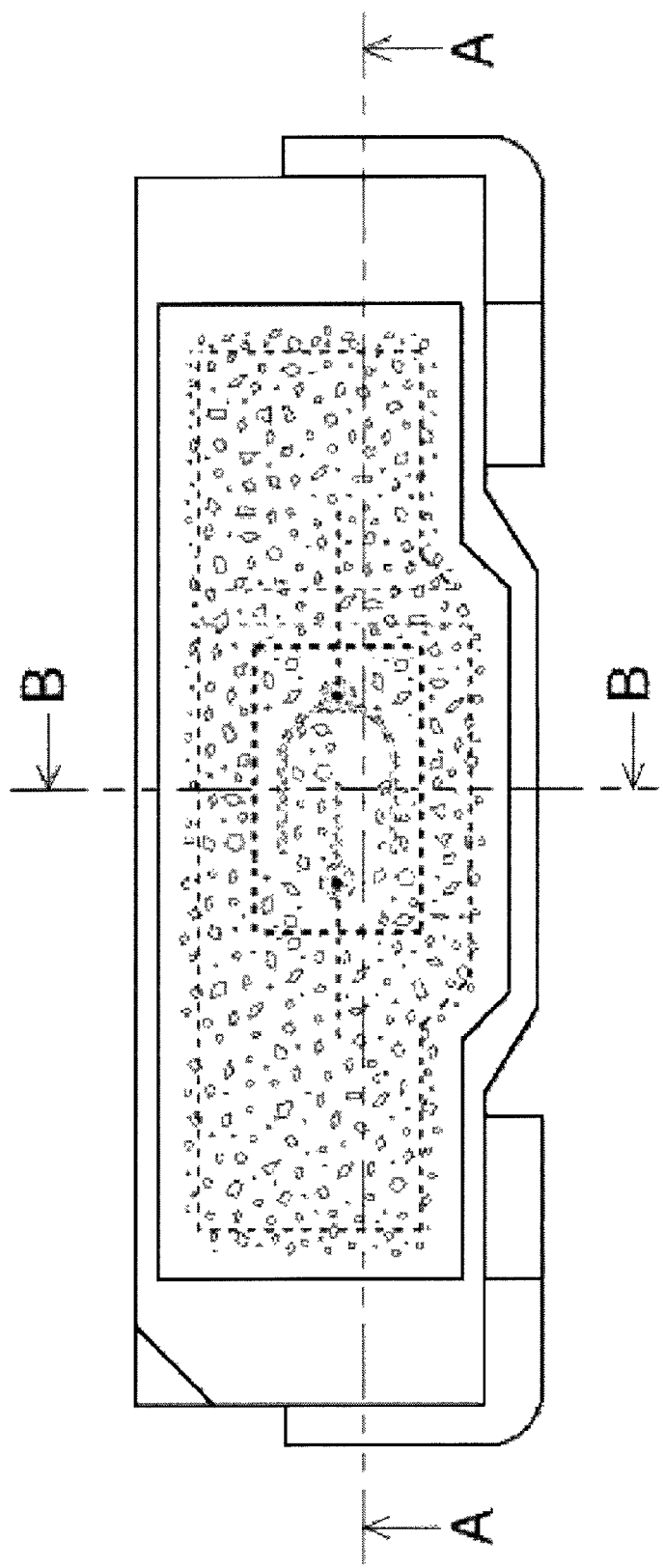

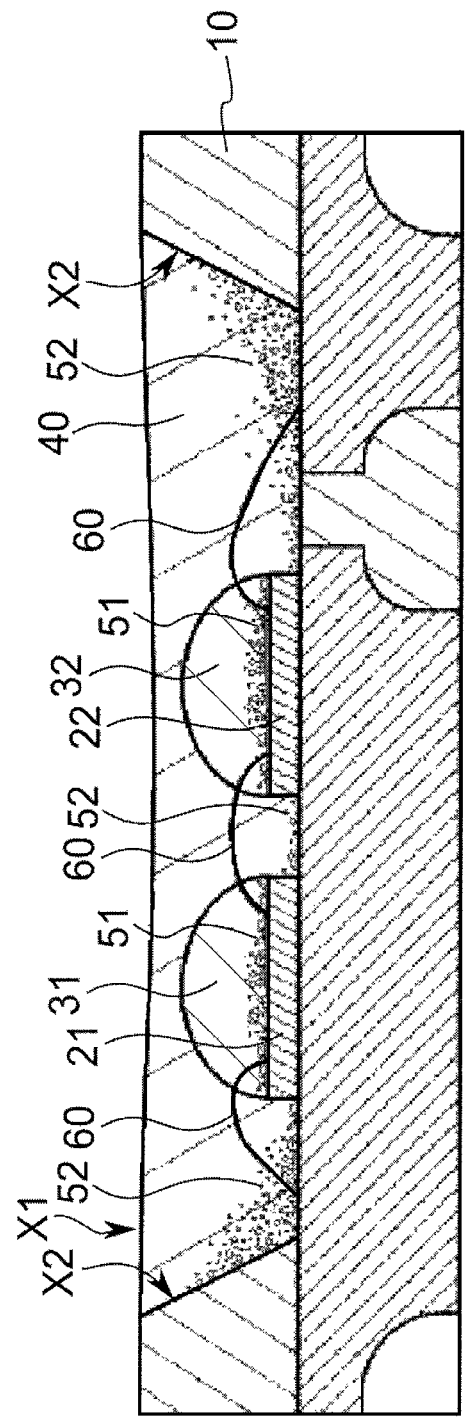

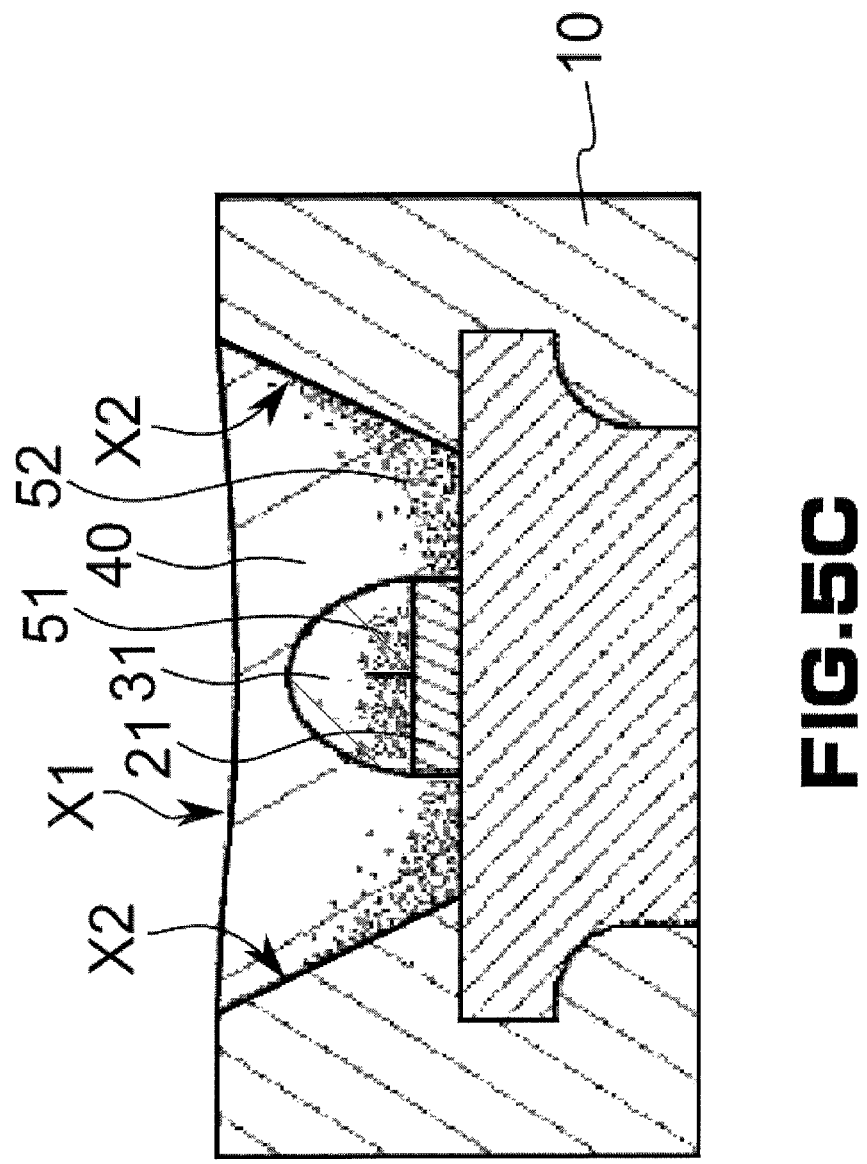

LIGHT EMITTING DEVICE

BACKGROUND

1. Field

The present disclosure relates to a light emitting device.

2. Description of the Related Art

Conventionally, there has been proposed a light emitting device with fluorescent bodies which have specific gravities differing from each other and which are provided in a recess of a package mounted with a light emitting element (refer to Japanese Patent Application Laid-open No. 2007-103512).

SUMMARY

A light emitting device comprising: a package having a recess; a light emitting element mounted in the recess of the package; a transmissive member provided above the light emitting element; a sealing resin that seals the recess of the package; a first fluorescent material contained in the transmissive member; and a second fluorescent material contained in the sealing resin and having a specific gravity different from that of the first fluorescent material, wherein a greater amount of the second fluorescent material is distributed to a side of the light emitting element than above the light emitting element, and a side surface of the light emitting element is exposed on the sealing resin.

BRIEF DESCRIPTION OF THE DRAWINGS

FIGS. 4A to 4C are schematic views of a side view type light emitting device to which the first to third embodiments can be favorably applied, wherein FIG. 4A represents a schematic plan view, FIG. 4B represents a schematic view of a cross section A-A in FIG. 4A, and FIG. 4C represents a schematic view of a cross section B-B in FIG. 4A; and FIGS. 5A to 5C are schematic views of a top view type light emitting device to which the first to third embodiments can be favorably applied, wherein FIG. 5A represents a schematic plan view, FIG. 5B represents a schematic view of a cross section C-C in FIG. 5A, and FIG. 5C represents a schematic view of a cross section D-D in FIG. 5A.

DETAILED DESCRIPTION OF EMBODIMENTS

Hereinafter, embodiments will be described with reference to the attached drawings. With the conventional light emitting device described above, since a lighter fluorescent material is deposited above a heavier fluorescent material, a problem arises in that light cannot be efficiently extracted from the heavier fluorescent material and, in particular, light from the heavier fluorescent material is absorbed by the lighter fluorescent material when an emission wavelength of the heavier fluorescent material overlaps with an absorption wavelength of the lighter fluorescent material. However, according to the embodiments, light can be respectively extracted from fluorescent bodies with specific gravities that differ from one another even if an emission wavelength overlaps with an absorption wavelength between the fluorescent bodies.

[Light Emitting Device According to First Embodiment]

Figure 1:
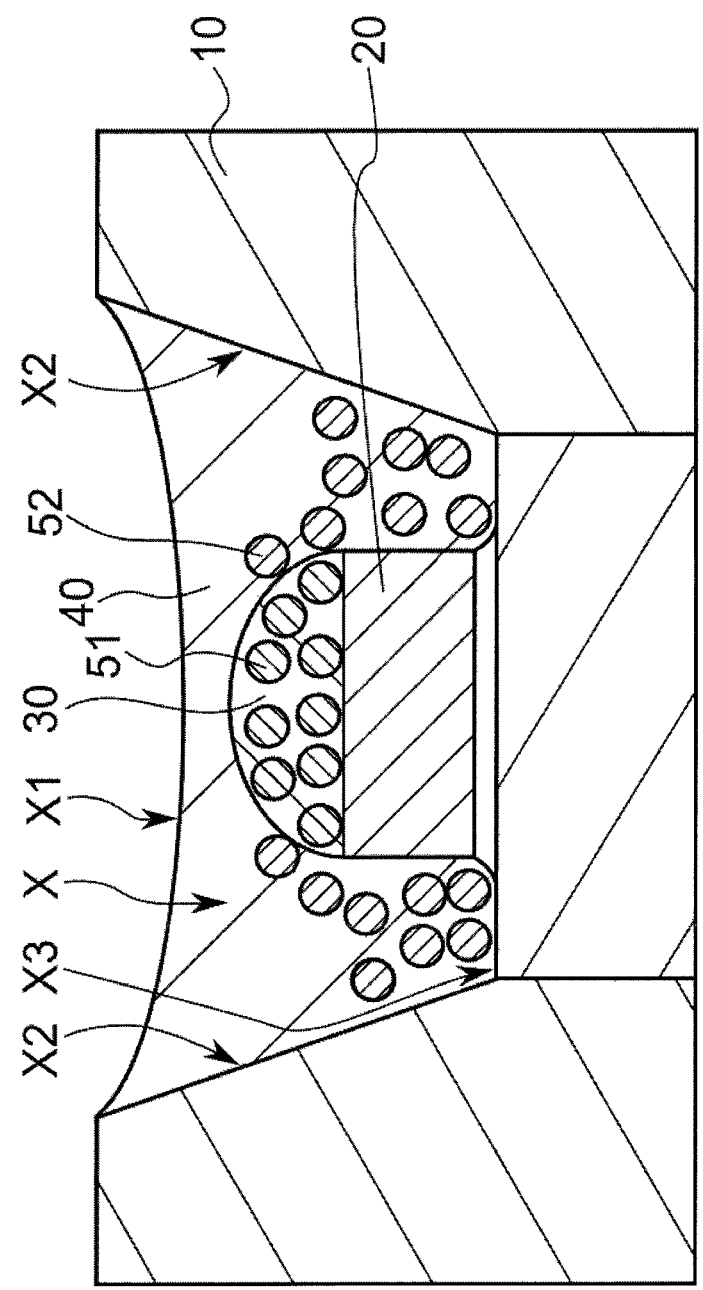
FIG. 1 is a schematic view showing a general configuration of a light emitting device according to a first embodiment.

FIG. 1 is a schematic view showing a general configuration of a light emitting device according to a first embodiment.

As shown in FIG. 1, the light emitting device according to the first embodiment is a light emitting device which includes a package 10 having a recess X, a light emitting element 20 mounted in the recess X of the package 10, a transmissive member 30 provided above the light emitting element 20, a sealing resin 40 that seals the recess X of the package 10, a first fluorescent material 51 contained in the transmissive member 30, and a second fluorescent material 52 contained in the sealing resin 40 and having a specific gravity different from that of the first fluorescent material 51, wherein a greater amount of the second fluorescent material 52 is distributed to a side of the light emitting element 20 than above the light emitting element 20, and a side surface of the light emitting element 20 is exposed on the sealing resin 40.

A description will now be given in order.

(Package 10)

For the package 10, for example, a thermoplastic resin such as polyphthalamide (PPA), polyphenylene sulfide (PPS), liquid crystal polymer, and nylon, a thermosetting resin such as epoxy resin, silicone resin, modified epoxy resin, modified silicone resin, urethane resin, and acrylate resin as well as glass epoxy resin, ceramics, glass, or the like can be used. Moreover, as ceramics, alumina, aluminum nitride, mullite, silicon carbide, or silicon nitride are favorably used. Alumina and mullite are particularly favorable due to their high reflectance and low cost.

The recess X included in the package 10 has a bottom surface X3 that is flat enough to allow mounting of the light emitting element 20 and has a shape that can be filled by the sealing resin 40. Examples of such a recess X include a recess with a trapezoidal cross section (refer to FIG. 1). With the package 10 having a recess with a trapezoidal cross section (refer to FIG. 1), since light emitted from the light emitting element 20 is reflected at a recess side wall X2 toward a recess opening X1, light extraction efficiency of the light emitting device is improved.

(Light Emitting Element 20)

For example, a light emitting diode can be used as the light emitting element 20. As the light emitting diode, for example, a light emitting diode can be used which has a growth substrate (for example, a sapphire substrate) with insulating and light-transmitting properties and a laminated structure including an active layer formed on the growth substrate. Moreover, the laminated structure including an active layer may be formed by various semiconductors (for example, a nitride semiconductor such as InN, AlN, GaN, InGaN, AlGaN, and InGaAlN, a III-V group compound semiconductor, and a II-VI group compound semiconductor).

While a mounting method of the light emitting element 20 is not particularly limited, for example, the light emitting element 20 can be mounted to the recess X of the package 10 by arranging the growth substrate side as a mounting surface. In this case, for example, the light emitting element 20 is electrically connected to an external electrode of the package 10 by wire bonding. On the other hand, the light emitting element 20 can be mounted to the recess X of the package 10 by arranging the laminated structure side including an active layer as a mounting surface. In this case, for example, the light emitting element 20 is electrically connected to an external electrode of the package 10 by flip-chip mounting.

The side surface of the light emitting element 20 is exposed on the sealing resin 40. Even if a greater amount of the second fluorescent material 52 is distributed to the side of the light emitting element 20 than above the light emitting element 20, if the transmissive member 30 coats the side surface of the light emitting element 20, light emitted from the side surface of the light emitting element 20 is reflected (in particular, totally reflected) by the transmissive member 30. Therefore, in this case, light emitted from the side surface of the light emitting element 20 cannot be efficiently used to excite the second fluorescent material 52. However, by exposing the side surface of the light emitting element 20 to the sealing resin 40, since the side surface of the light emitting element 20 is not coated by the transmissive member 30, light emitted from the side surface of the light emitting element 20 can be efficiently used to excite the second fluorescent material 52.

(Transmissive Member 30)

A member having a property of transmitting light from the light emitting element 20 is used as the transmissive member 30. Although the degree of translucency is not particularly limited, for example, in addition to a member that transmits 100% of light emitted from the light emitting element 20, a member that transmits around 70% or more, 80% or more, 90% or more, or 95% or more of light emitted from the light emitting element 20 is favorably used as the transmissive member 30.

As the transmissive member 30, a member having light-resistant, e.g. resistant to deterioration such as change in color and change in shape, and insulating properties, in addition to transmitting light from the light emitting element 20, is favorably used. Examples of members having such properties include organics such as silicone resin, epoxy resin, urea resin, fluororesin and hybrid resins containing at least one of these resins (for example, a silicone resin composition, a modified silicone resin composition, an epoxy resin composition, a modified epoxy resin composition, and an acrylic resin composition).

While the transmissive member 30 may be provided at any position above the light emitting element 20, it is preferable that the transmissive member 30 is provided at a position where an amount of the second fluorescent material 52 that is distributed in an area sandwiched between the transmissive member 30 and the light emitting element 20 is small; and it is more preferable that the light transmissive member 30 is provided on an upper surface of the light emitting element 20 as shown in FIG. 1. Accordingly, since the amount of the second fluorescent material 52 distributed above the light emitting element 20 is reduced (or becomes zero), light emitted from the first fluorescent material 51 is less frequently reflected by the second fluorescent material 52 and, as a result, the light emitted from the first fluorescent material 51 can be more easily extracted from the recess opening X1 of the package 10.

A member having a surface that prevents deposition of the second fluorescent material 52 is favorably used as the transmissive member 30. Accordingly, since the amount of the second fluorescent material 52 distributed above the light emitting element 20 is reduced (or becomes zero), light emitted from the first fluorescent material 51 is less frequently reflected by the second fluorescent material 52 and, as a result, the light emitted from the first fluorescent material 51 can be more easily extracted from the recess opening X1 of the package 10.

In addition, as the transmissive member 30, favorably, a member that is projected toward the recess opening X1 of the package 10 (refer to FIG. 1), a member having a height approaching the recess opening X1 of the package 10 (refer to FIG. 2), a member that is projected toward the light emitting element 20 (for example, an inverse trapezoidal shape), or a member that combines these shapes is used.

As a member that is projected toward the recess opening X1 of the package 10, members having a trapezoidal shape, a dome shape, or a semi-cylindrical shape (a shape in which a curved surface side of a bisected cylinder faces the recess opening X1 of the package 10 and a flat surface side thereof faces the light emitting element 20) can be used. Among these members, favorably, a member having a shape that is less likely to totally reflect the light from the light emitting element 20 is used. Examples of such a member include a lens-like member having a curvature radius of 0.66 mm in a longitudinal direction and 0.16 mm in a lateral direction when a height of the sealing resin 40 is approximately 100 μm.

A member that is projected toward the recess opening X1 of the package 10 is favorably provided by, for example, potting a thermosetting resin on the upper surface of the light emitting element 20 and hardening the thermosetting resin. Accordingly, due to surface tension of the thermosetting resin, a surface of the projection acquires a shape that prevents deposition of the second fluorescent material 52.

A microstructure such as recesses and projections or a microlens is favorably provided on the surface of the transmissive member 30. Accordingly, since reflection at an interface between the transmissive member 30 and the sealing resin 40 is reduced, light extraction efficiency of the light emitting device increases. Moreover, since the sealing resin 40 is not hardened and readily spreads to its surroundings during a forming step thereof, even if recesses and projections are formed on the transmissive member 30, the second fluorescent material 52 does not accumulate (or only a small amount of the second fluorescent material 52 accumulates) on such recesses and projections.

(Sealing Resin 40)

For example, materials similar to those described for the transmissive member 30 above can be used as the sealing resin 40.

For example, the sealing resin 40 is provided by potting a resin in the recess X of the package 10 and hardening the resin.

Moreover, a height of the light emitting element 20, a height of the transmissive member 30, and a height of the sealing resin 40 favorably satisfy a relationship expressed as (height of sealing resin 40−height of light emitting element 20−height of transmissive member 30)≤300 μm, more favorably satisfy a relationship expressed as (height of sealing resin 40−height of light emitting element 20−height of transmissive member 30)≤150 μm, and even more favorably satisfy a relationship expressed as (height of sealing resin 40−height of light emitting element 20−height of transmissive member 30)≤50 μm. Accordingly, since the amount of the second fluorescent material 52 distributed above the light emitting element 20 is reduced (or becomes zero), light emitted from the first fluorescent material 51 is less frequently reflected by the second fluorescent material 52 and, as a result, the light emitted from the first fluorescent material 51 can be more easily extracted from the recess opening X1 of the package 10.

(First Fluorescent Material 51 and Second Fluorescent Material 52)

The first fluorescent material 51 is contained in the transmissive member 30 while the second fluorescent material 52 is contained in the sealing resin 40. The second fluorescent material 52 differs from the first fluorescent material 51 in specific gravity. An emission wavelength of one of the first fluorescent material 51 and the second fluorescent material 52 may or may not overlap with an absorption wavelength of the other of the first fluorescent material 51 and the second fluorescent material 52.

A greater amount of the second fluorescent material 52 exists to the side of the light emitting element 20 than above the light emitting element 20. Accordingly, since the amount of the second fluorescent material 52 distributed above the light emitting element 20 becomes smaller than the amount of the second fluorescent material 52 distributed to the side of the light emitting element 20 (or becomes zero), light emitted from the first fluorescent material 51 is less frequently reflected by the second fluorescent material 52 and, as a result, the light emitted from the first fluorescent material 51 can be more easily extracted from the recess opening X1 of the package 10. In addition, since the amount of the second fluorescent material 52 distributed to the side of the light emitting element 20 becomes larger than the amount of the second fluorescent material 52 distributed above the light emitting element 20, the light emitted from the side surface of the light emitting element 20 can be efficiently used to excite the second fluorescent material 52. Moreover, when the light emitted from the side surface of the light emitting element 20 is efficiently used to excite the second fluorescent material 52, since it is more difficult for the light emitted from the side surface of the light emitting element 20 to reach the recess side wall X2 of the package 10, the light emitted from the side surface of the light emitting element 20 can be prevented from passing through the recess side wall X2 of the package 10 and exiting the package 10.

Examples of the distribution described above include a mode such as that shown in FIG. 1 where the second fluorescent material 52 is deposited on the recess bottom surface X3 of the package 10. Such a mode can be formed by, for example, depositing the second fluorescent material 52 in the recess X of the package 10 before hardening the sealing resin 40.

As the first fluorescent material 51 and the second fluorescent material 52, a fluorescent material which is excited by light emitted from the light emitting element 20 and which emits light can be used. While a fluorescent material that emits light with a shorter wavelength than the light emitted from the light emitting element 20 can be used, a fluorescent material that emits light with a longer wavelength is more favorable. Accordingly, since the fluorescent material can efficiently emit light, light extraction efficiency of the light emitting device increases.

Examples of materials that can be used as a fluorescent material that emits light with a longer wavelength than the light emitted from the light emitting element 20 include, but are not limited to: (1) a nitride-based fluorescent material, an oxynitride-based fluorescent material, an $\alpha$ or $\beta$ sialon-type fluorescent material or various alkaline earth metal silicate nitride fluorescent materials, each of which is mainly activated by a lanthanoid element such as Eu or Ce, (2) an alkaline earth metal halogen apatite fluorescent material, an alkaline earth halosilicate fluorescent material, an alkaline earth metal silicate fluorescent material, an alkaline earth metal halogen borate fluorescent material, an alkaline earth metal aluminate fluorescent material, an alkaline earth metal silicate, an alkaline earth metal sulfide, an alkaline earth metal thiogallate, an alkaline earth metal silicon nitride, and germinate, each of which is mainly activated by a lanthanoid element such as Eu or a transition metal element such as Mn, (3) a rare earth aluminate or a rare earth silicate, each of which is mainly activated by a lanthanoid element such as Ce, and (4) organics or organic complexes, each of which is mainly activated by a lanthanoid element such as Eu. Obviously, fluorescent materials which produce similar performance and effects to the fluorescent materials described above can be used instead. Moreover, when a nitride semiconductor based light emitting element is used as the light emitting element 20, for example, a fluorescent material (fluorescent material) such as a YAG fluorescent material (green to yellow fluorescent material), a LAG fluorescent material (green to yellow fluorescent material), a CASN fluorescent material (red fluorescent material), a SCASN fluorescent material (red fluorescent material), a KSF fluorescent material (red fluorescent material), a $\beta$ sialon fluorescent material (green to yellow fluorescent material), or a chlorosilicate fluorescent material (green fluorescent material) is favorably used.

An example of a favorable combination of the first fluorescent material 51 and the second fluorescent material 52 is a case where an emission wavelength of the first fluorescent material 51 is longer than an emission wavelength of the second fluorescent material 52. Accordingly, even if the emission wavelength of the second fluorescent material 52 overlaps with an absorption wavelength of the first fluorescent material 51, light emitted from the second fluorescent material 52 can be prevented from being easily absorbed by the first fluorescent material 51.

Other examples of favorable combinations of the first fluorescent material 51 and the second fluorescent material 52 include the first fluorescent material 51 (a SCASN fluorescent material)/the second fluorescent material 52 (a YAG (LAG) fluorescent material), the first fluorescent material 51 (a CASN fluorescent material)/the second fluorescent material 52 (a YAG (LAG) fluorescent material), the first fluorescent material 51 (a KSF fluorescent material)/the second fluorescent material 52 (a YAG (LAG) fluorescent material), and the first fluorescent material 51 (a KSF fluorescent material)/the second fluorescent material 52 (a $\beta$ sialon or a chlorosilicate fluorescent material). Since the transmissive member 30 is smaller (in some cases, drastically smaller) in volume than the sealing resin 40, an amount of the first fluorescent material 51 that can be contained in the transmissive member 30 is smaller (in some cases, drastically smaller) than an amount of the second fluorescent material 52 that can be contained in the sealing resin 40. And, for example, in the case of the first fluorescent material 51 (a SCASN fluorescent material)/the second fluorescent material 52 (a YAG (LAG) fluorescent material), since an emission wavelength of the YAG (LAG) fluorescent material is broad on the long wavelength side of a wavelength spectrum and overlaps with an emission wavelength of the SCASN fluorescent material, the YAG (LAG) fluorescent material is required in a greater amount than the SCASN fluorescent material when creating white light by synthesizing light from a red fluorescent material and a yellow fluorescent material. Seen from another angle, the SCASN fluorescent material is only required in a smaller amount (in some cases, a drastically smaller amount) than the YAG (LAG) fluorescent material. Therefore, by using a SCASN fluorescent material as the first fluorescent material 51 and a YAG (LAG) fluorescent material as the second fluorescent material 52 as in the example described above, even with a small light emitting device, the transmissive member 30 and the sealing resin 40 can contain sufficient amounts of the first fluorescent material 51 and the second fluorescent material 52 which are required to produce white light. In other words, a fluorescent material that is required in a greater amount is favorably used as the second fluorescent material 52 in order to produce a desired hue, and another combination example is the first fluorescent material 51 (a β sialon or a chlorosilicate fluorescent material)/the second fluorescent material 52 (a KSF fluorescent material). Since the KSF fluorescent material in the example given above is less likely to absorb blue light and also has a large particle size, the KSF fluorescent material is required in a greater amount than the β sialon or a chlorosilicate fluorescent material in order to produce a desired hue.

When the second fluorescent material 52 is deposited lower than the active layer of the light emitting element 20 to the side of the light emitting element 20, since light emitted from a side surface in an area below the active layer of the light emitting element 20 (for example, the growth substrate) enters the second fluorescent material 52 immediately after being emitted, the light emitted from the side surface in the area below the active layer of the light emitting element 20 (for example, the growth substrate) can be efficiently used to excite the second fluorescent material 52.

On the other hand, when the second fluorescent material 52 is deposited higher than the active layer of the light emitting element 20 to the side of the light emitting element 20, since light emitted from a side surface of the active layer of the light emitting element 20 in addition to light emitted from a side surface in an area below the active layer of the light emitting element 20 (for example, the growth substrate) enters the second fluorescent material 52 immediately after being emitted, both the light emitted from a side surface in an area below the active layer of the light emitting element 20 (for example, the growth substrate) and the light emitted from a side surface of the active layer of the light emitting element 20 can be efficiently used to excite the second fluorescent material 52.

[Light Emitting Device According to Second Embodiment]

Figure 2:
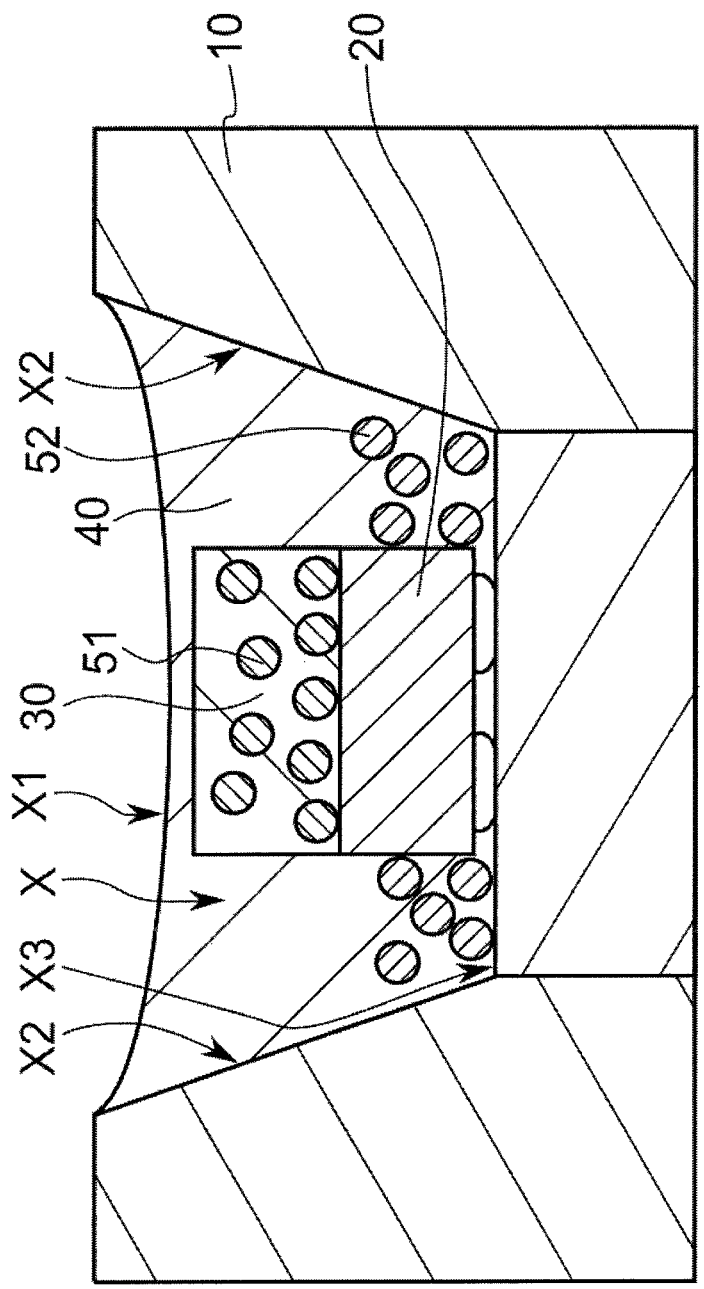
FIG. 2 is a schematic view showing a general configuration of a light emitting device according to a second embodiment.

FIG. 2 is a schematic view showing a general configuration of a light emitting device according to a second embodiment.

As shown in FIG. 2, the light emitting device according to the second embodiment differs from the light emitting device according to the first embodiment in that the light emitting element 20 is flip-chip mounted and that the transmissive member 30 has a height approaching the recess opening X1 of the package 10.

Even in the light emitting device according to the second embodiment, in a similar manner to the light emitting device according to the first embodiment, the first fluorescent material 51 is contained in the transmissive member 30, the second fluorescent material 52 of which specific gravity differs from that of the first fluorescent material 51 is contained in the sealing resin 40, a greater amount of the second fluorescent material 52 is distributed to a side of the light emitting element 20 than above the light emitting element 20, and a side surface of the light emitting element 20 is exposed on the sealing resin 40.

(Transmissive Member 30)

The transmissive member 30 has a height that approaches the recess opening X1 of the package 10. Accordingly, since the amount of the second fluorescent material 52 distributed above the light emitting element 20 is reduced (or becomes zero), light emitted from the first fluorescent material 51 is less frequently reflected by the second fluorescent material 52 and, as a result, the light emitted from the first fluorescent material 51 can be more easily extracted from the recess opening X1 of the package 10.

Moreover, examples of cases where the transmissive member 30 has a height that approaches the recess opening X1 of the package 10 include a case where a distance between the upper surface of the transmissive member 30 and the recess opening X1 of the package 10 is around 100 μm, a case where a distance between the transmissive member 30 and the recess opening X1 of the package 10 is shorter than a thickness of the transmissive member 30, and a case where a distance between the transmissive member 30 and the recess opening X1 of the package 10 is shorter than a thickness of the light emitting element 20.

The transmissive member 30 is favorably bonded to the upper surface of the light emitting element 20. For example, when using a flip-chip mounting light emitting diode having positive and negative electrodes on a same surface, since there is no need to provide conduction from the upper surface of the light emitting element 20, the transmissive member 30 can be easily bonded to the upper surface of the light emitting element 20.

[Light Emitting Device According to Third Embodiment]

Figure 3:
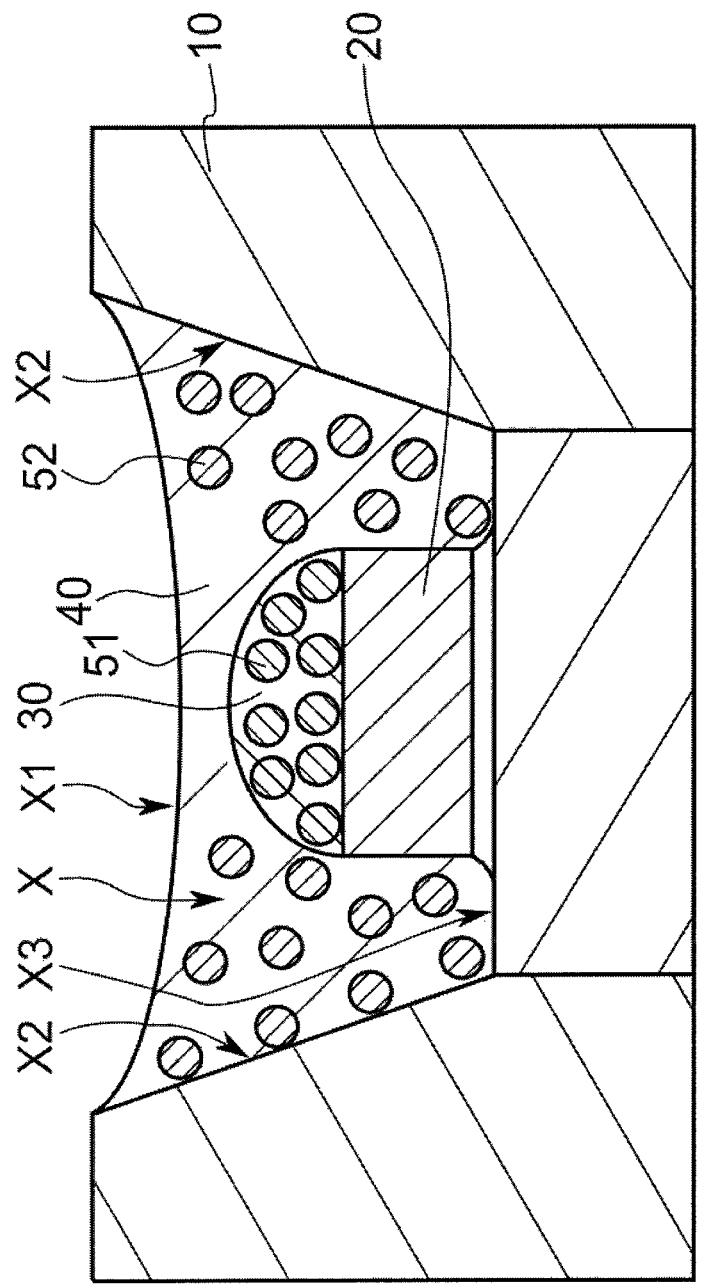
FIG. 3 is a schematic view showing a general configuration of a light emitting device according to a third embodiment.

FIG. 3 is a schematic view showing a general configuration of a light emitting device according to a third embodiment.

As shown in FIG. 3, the light emitting device according to the third embodiment differs from the light emitting device according to the first embodiment in that the second fluorescent material 52 is not deposited on the recess bottom surface X3 of the package 10.

Even in the light emitting device according to the third embodiment, in a similar manner to the light emitting device according to the first embodiment, the first fluorescent material 51 is contained in the transmissive member 30, the second fluorescent material 52 of which specific gravity differs from that of the first fluorescent material 51 is contained in the sealing resin 40, a greater amount of the second fluorescent material 52 is distributed to a side of the light emitting element 20 than above the light emitting element 20, and a side surface of the light emitting element 20 is exposed on the sealing resin 40.

As described above, in the light emitting devices according to the first to third embodiments, since a greater amount of the second fluorescent material 52 is distributed to the side of the light emitting element 20 than above the light emitting element 20 and a side surface of the light emitting element 20 is exposed on the sealing resin 40, light emitted from the first fluorescent material 51 is more easily extracted from the recess opening X1 of the package 10 and light emitted from the side surface of the light emitting element 20 can be efficiently used to excite the second fluorescent material 52. Therefore, according to the first to third embodiments, light can be efficiently extracted from both the first fluorescent material 51 and the second fluorescent material 52, which have different specific gravities from each other, when an emission wavelength of one of the first fluorescent material 51 and the second fluorescent material 52 does not overlap with an absorption wavelength of the other of the first fluorescent material 51 and the second fluorescent material 52.

In addition, according to the first to third embodiments, light can be efficiently extracted from both the first fluorescent material 51 and the second fluorescent material 52 of which specific gravities differ from each other even when an emission wavelength of one of the first fluorescent material 51 and the second fluorescent material 52 overlaps with an absorption wavelength of the other of the first fluorescent material 51 and the second fluorescent material 52.

For example, in a case where the emission wavelength of the first fluorescent material 51 overlaps with the absorption wavelength of the second fluorescent material 52 and the specific gravity of the second fluorescent material 52 is lighter than the specific gravity of the first fluorescent material 51, the second fluorescent material 52 ends up being deposited above the first fluorescent material 51 due to sedimentation and light emitted from the first fluorescent material 51 is more frequently absorbed by the second fluorescent material 52. However, according to the first to third embodiments, since the first fluorescent material 51 is distributed inside the transmissive member 30 and a greater amount of the second fluorescent material 52 is distributed to the side of the light emitting element 20 than above the light emitting element 20, the amount of the second fluorescent material 52 distributed above the first fluorescent material 51 is reduced. Therefore, according to the first to third embodiments, light emitted from the first fluorescent material 51 is less frequently absorbed by the second fluorescent material 52 and can be extracted in an efficient manner.

In addition, for example, in a case where the emission wavelength of the second fluorescent material 52 overlaps with the absorption wavelength of the first fluorescent material 51 and the specific gravity of the first fluorescent material 51 is lighter than the specific gravity of the second fluorescent material 52, the first fluorescent material 51 ends up being deposited above the second fluorescent material 52 due to sedimentation and light emitted from the second fluorescent material 52 is more frequently absorbed by the first fluorescent material 51. However, according to the first to third embodiments, since the first fluorescent material 51 is distributed inside the transmissive member 30, the amount of the first fluorescent material 51 distributed above the second fluorescent material 52 is reduced. Therefore, according to the first to third embodiments, light emitted from the second fluorescent material 52 is less frequently absorbed by the first fluorescent material 51 and can be extracted in an efficient manner.

The first to third embodiments can be particularly favorably applied to a light emitting device in which the recess side wall X2 of the package 10 is thin enough that light passes through the recess side wall X2 even when a reflective member is provided (for example, a light emitting device in which the thickness of the recess side wall X2 of the package 10 is around 0.1 mm). According to the first to third embodiments, since the light emitted from the side surface of the light emitting element 20 can be prevented from passing through the recess side wall X2 of the package 10 and exiting the package 10, light can be respectively extracted in an efficient manner from fluorescent bodies of which specific gravities differ from each other in a light emitting device in which the recess side wall X2 of the package 10 is thin.

Furthermore, the first to third embodiments can also be favorably applied to a light emitting element 20 that uses ceramics for the package 10. Since ceramics are inorganic materials that hardly deteriorate and are highly reliable, ceramics have lower reflectance than resin materials containing light reflecting members and are likely to transmit light from the light emitting element 20. However, according to the first to third embodiments, since the light emitted from the side surface of the light emitting element 20 can be prevented from passing through the recess side wall X2 of the package 10 and exiting the package 10, light can be respectively extracted in an efficient manner from fluorescent bodies of which specific gravities differ from each other in a light emitting device that uses ceramics for the package 10.

Figure 4B:
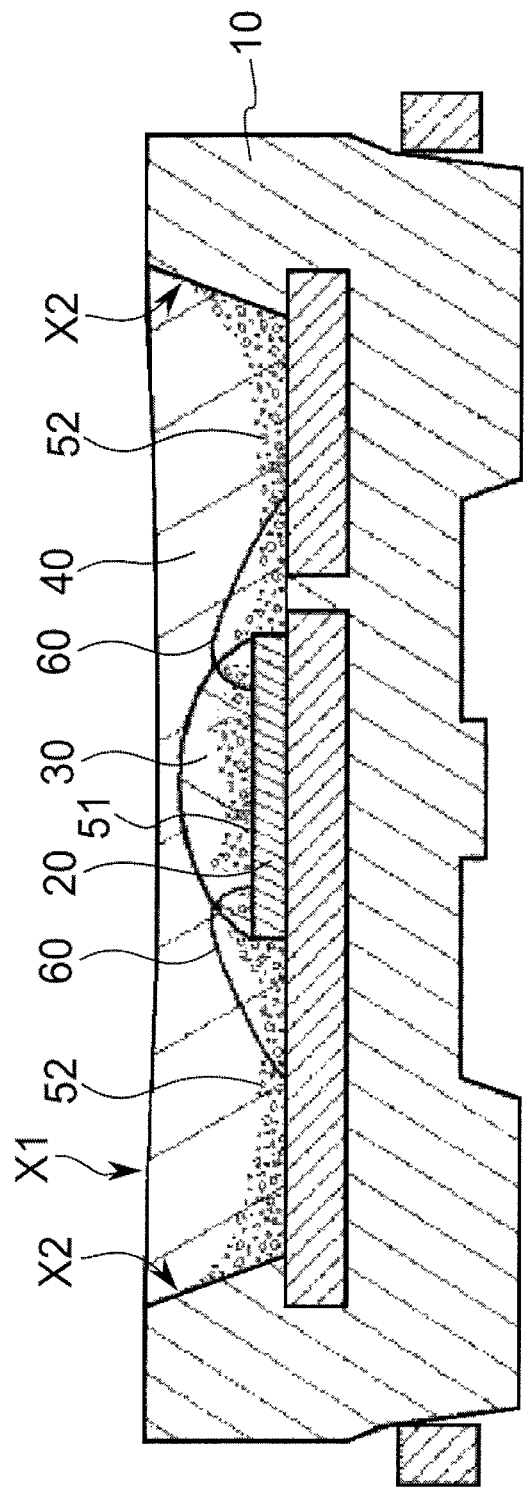
Figure 4C:
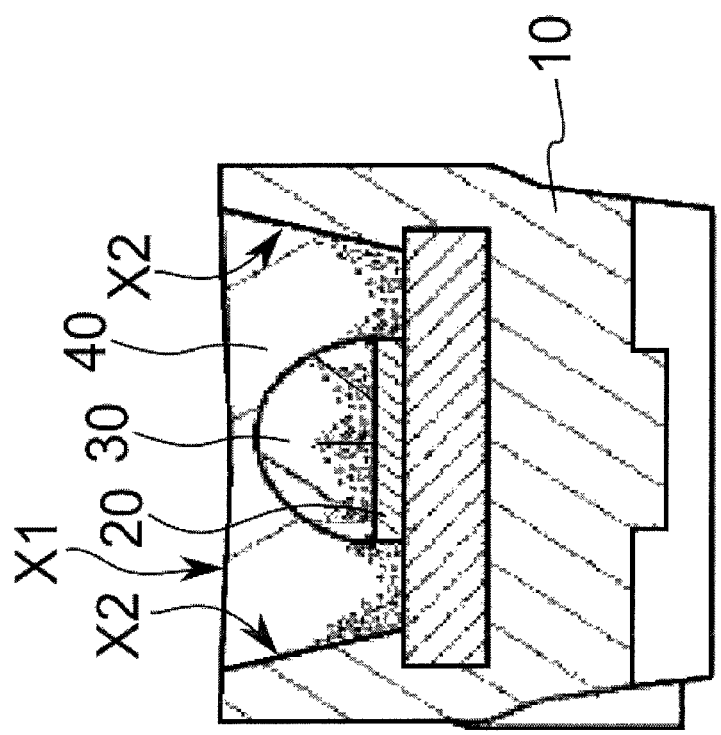

FIGS. 4A to 4C are schematic views of a side view type light emitting device to which the first to third embodiments can be favorably applied, wherein FIG. 4A represents a schematic plan view, FIG. 4B represents a schematic view of a cross section A-A in FIG. 4A, and FIG. 4C represents a schematic view of a cross section B-B in FIG. 4A.

The first to third embodiments can also be applied to a side view type light emitting device such as that shown in FIGS. 4A to 4C. In the side view type light emitting device shown in FIGS. 4A to 4C, the transmissive member 30 is provided on the upper surface of the light emitting element 20 by potting after the light emitting element 20 is electrically connected to an external electrode of the package 10 by wire bonding using a wire 60. The wire 60 is projected from the transmissive member 30.

Figure 5A:
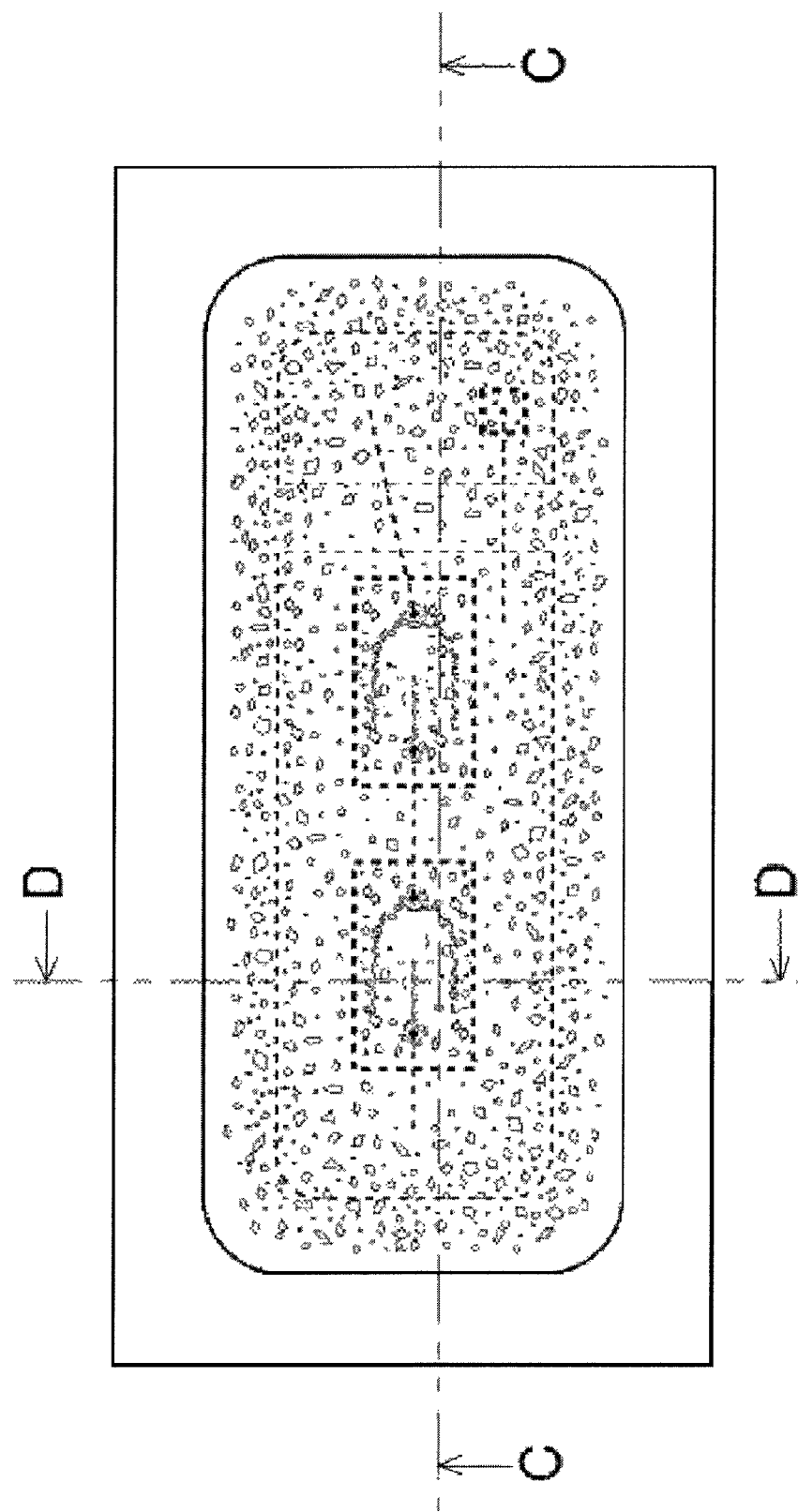

FIGS. 5A to 5C are schematic views of a top view type light emitting device to which the first to third embodiments can be favorably applied, wherein FIG. 5A represents a schematic plan view, FIG. 5B represents a schematic view of a cross section C-C in FIG. 5A, and FIG. 5C represents a schematic view of a cross section D-D in FIG. 5A.

The first to third embodiments can also be applied to a top view type light emitting device such as that shown in FIGS. 5A to 5C. The top view type light emitting device shown in FIGS. 5A to 5C includes a plurality of light emitting elements 21 and 22. The light emitting elements 21 and 22 are respectively provided with transmissive members 31 and 32. The light emitting elements 21 and 22 are connected in series using the wire 60, and both ends of the wire 60 connecting the light emitting elements 21 and 22 are respectively coated by the transmissive members 31 and 32. The second fluorescent material 52 is distributed not only between the light emitting elements 21 and 22 and the side wall surface X2 of the package 10 but also between the light emitting element 21 and the light emitting element 22.

While first to third embodiments have been described above, the description merely represents examples and is not intended to limit the construction as defined in the scope of the claims in any way whatsoever.

10 package
20 light emitting element
21 light emitting element
22 light emitting element
30 transmissive member
31 transmissive member
32 transmissive member
40 sealing resin
51 first fluorescent material
52 second fluorescent material
60 wire
X recess
X1 recess opening
X2 recess side wall
X3 recess bottom surface

What is claimed is:
1. A light emitting device comprising:
a package comprising a recess;
a light emitting element mounted in the recess of the package;
a transmissive member provided above the light emitting element;

a sealing resin that covers the light emitting element and the transmissive member, and seals the recess of the package;

a first fluorescent material contained in the transmissive member; and a second fluorescent material contained in the sealing resin and comprising a specific gravity different from that of the first fluorescent material, wherein a greater amount of the second fluorescent material is distributed to a side of the light emitting element than above the light emitting element, and a side surface of the light emitting element is exposed on the sealing resin, wherein the first and second fluorescent materials are materials that emit light upon being excited by light emitted from the light emitting element, and wherein the transmissive member has a height approaching a recess opening of the package.

2. The light emitting device according to claim 1, wherein an emission wavelength of one of the first fluorescent material and the second fluorescent material overlaps with an absorption wavelength of the other of the first fluorescent material and the second fluorescent material.

3. The light emitting device according to claim 2, wherein the second fluorescent material is deposited on a recess bottom surface of the package.

4. The light emitting device according to claim 3, wherein the second fluorescent material is deposited lower than an active layer of the light emitting element.

5. The light emitting device according to claim 3, wherein the second fluorescent material is deposited higher than an active layer of the light emitting element.

6. The light emitting device according to claim 2, wherein the transmissive member comprises a surface that prevents deposition of the second fluorescent material.

7. The light emitting device according to claim 2, wherein the transmissive member is provided on an upper surface of the light emitting element.

8. The light emitting device according to claim 7, wherein the transmissive member is bonded to the upper surface of the light emitting element.

9. The light emitting device according to claim 2, wherein an emission wavelength of the first fluorescent material is longer than an emission wavelength of the second fluorescent material.

10. The light emitting device according to claim 1, wherein the second fluorescent material is deposited on a recess bottom surface of the package.

11. The light emitting device according to claim 10, wherein the second fluorescent material is deposited lower than an active layer of the light emitting element.

12. The light emitting device according to claim 10, wherein the second fluorescent material is deposited higher than an active layer of the light emitting element.

13. The light emitting device according to claim 1, wherein the transmissive member comprises a surface that prevents deposition of the second fluorescent material.

14. The light emitting device according to claim 1, wherein the transmissive member is projected toward a recess opening of the package.

15. The light emitting device according to claim 1, wherein the transmissive member is provided on an upper surface of the light emitting element.

16. The light emitting device according to claim 15, wherein the transmissive member is bonded to the upper surface of the light emitting element.

17. The light emitting device according to claim 1, wherein an emission wavelength of the first fluorescent material is longer than an emission wavelength of the second fluorescent material.

18. The light emitting device according to claim 1, wherein a distance between an upper surface of the transmissive member and the recess opening of the package is about 100 μm.

19. The light emitting device according to claim 1, wherein a distance between an upper surface of the transmissive member and the recess opening of the package is smaller than a thickness of the transmissive member.

20. The light emitting device according to claim 1, wherein a distance between an upper surface of the transmissive member and the recess opening of the package is smaller than a thickness of the light emitting element.

* * * * *